(12) United States Patent
Prakash et al.

(10) Patent No.: US 6,611,952 B1
(45) Date of Patent: Aug. 26, 2003

(54) INTERACTIVE MEMORY ALLOCATION IN A BEHAVIORAL SYNTHESIS TOOL

(76) Inventors: Shiv Prakash, 6939 SW. Wilsonville Rd., #140, Wilsonville, OR (US) 97070; David Gaines Burnette, 14305 SW. 114th Ave., Tigard, OR (US) 97224; Simon Waters, 11795 SW Tualatin Rd. #48, Tualatin, OR (US) 97062

( * ) Notice: Subject to any disclaimer, the term of this patent is extended or adjusted under 35 U.S.C. 154(b) by 278 days.

(21) Appl. No.: 09/839,376

(22) Filed: Apr. 20, 2001

Related U.S. Application Data
(60) Provisional application No. 60/257,923, filed on Dec. 21, 2000.

(51) Int. Cl.[7] .............................................. G06F 17/50
(52) U.S. Cl. ................................ 716/18; 716/11; 716/5
(58) Field of Search ................................ 716/18, 1, 11, 716/5, 6, 12, 17

(56) References Cited

U.S. PATENT DOCUMENTS

| | | | |
|---|---|---|---|
| 6,195,786 B1 | * 2/2001 | Raghunathan et al. | 716/2 |
| 6,467,075 B1 | * 10/2002 | Sato et al. | 716/18 |
| 6,477,689 B1 | * 11/2002 | Mandell et al. | 716/11 |
| 6,480,985 B1 | * 11/2002 | Reynolds et al. | 716/1 |
| 2002/0097269 A1 | * 7/2002 | Batcha et al. | |

FOREIGN PATENT DOCUMENTS

GB      2 367 225 A   *  3/2002

OTHER PUBLICATIONS

Elliott, John P., *Understanding Behavioral Synthesis: A Practical Guide to High–Level Design*, Ch. 2, pp. 5–23, and Ch. 9, pp. 155–172, Kluwer Academic Publishers, 1999.

* cited by examiner

*Primary Examiner*—Sara Crane
(74) *Attorney, Agent, or Firm*—Klarquist Sparkman, LLP (57) ABSTRACT

A behavioral synthesis tool for generating an integrated circuit design is described. The behavioral synthesis tool allows a designer to interactively allocate variables or arrays to memory resources without having to modify a source code description of the integrated circuit. The behavioral synthesis tool reads the source code description and generates a synthesis intermediate format stored in memory. The synthesis tool searches the in-memory synthesis intermediate format to find arrays for each process. The arrays are then listed in a graphical user interface (GUI). The GUI allows the designer to create memory resources, specifying the type of memory, the packing mode, etc. The designer can then drag and drop the array variables listed in the GUI onto the memory resources. Upon completion of modifying the memory allocation, the designer saves the changes illustrated in the GUI and such changes are effectuated by automatically updating the synthesis intermediate format.

29 Claims, 13 Drawing Sheets

INTERACTIVE MEMORY ALLOCATION IN A BEHAVIORAL SYNTHESIS TOOL

RELATED APPLICATION DATA

This Application claims priority to provisional application No. 60/257,923, filed Dec. 21, 2000, and entitled "Techniques for Rapid Implementation of High-Performance FPGAs from Algorithmic C Specifications."

FIELD OF THE INVENTION

The present invention relates generally to behavioral synthesis tools for creating integrated circuits, and more particularly relates to behavioral synthesis tools that allow for interactive memory allocation during the design of integrated circuits.

BACKGROUND

The design of complex computer hardware no longer begins with a circuit diagram. Instead, it begins with a software program that describes the behavior or functionality of a circuit. This software program is written in a hardware description language (HDL) that defines an algorithm to be performed with limited implementation details. Designers direct behavioral synthesis tools to generate alternate architectures by modifying constraints (such as clock period, number and type of data path elements, and desired number of clock cycles). Behavioral synthesis tools convert the HDL program into a register transfer level (RTL) description. The RTL description is used to ultimately generate a netlist that includes a list of components in the circuit and the interconnections between the components. This netlist is used to create the physical integrated circuit.

In HDL source code, arrays provide a powerful and convenient method for modeling the behavior of memories. That is, behavioral descriptions are used to manipulate groups of data in an abstract manner using arrays. These arrays are, under the control of the designer, mapped to memory. Behavioral synthesis tools automatically construct the logic to control the memory, freeing the designer to explore architectures using different memories with different characteristics (e.g., synchronous versus asynchronous, single port versus dual port), and make intelligent decisions about an appropriate implementation for a design.

An example HDL source code is shown in Table 1 below that declares three variables, a, b, and c, that are arrays. Each array contains 1024, 8-bit words. The code first declares a "subtype" to define the type of each element in the array. The code then defines a "type" to represent the array itself. Finally, the variables are declared, each variable representing an array.

TABLE 1

SUBTYPE word IS unsigned (7 DOWNTO 0);
TYPE array_type IS ARRAY (integer RANGE <>) of word,
VARIABLE a, b, c: array_type (0 to 1023)

Generally, the variables are accessed using loops, such as the loop shown below in Table 2. For variables that are mapped to a memory, a read or write of a variable corresponds to a memory read or write that will be implemented in hardware. When an array is mapped to memory, each element in the array is mapped to a memory location. For example, a(0) maps to address 0, a(1) maps to address 1 and a(1023) maps to address 1023, etc.

TABLE 2

FOR i IN 0 TO 15 LOOP
 a(i) := b (i) * c(i) +4;
END LOOP;

To map variables to a memory, the designer must specifically assign the variables to a memory in source code and specify the type of memory and other memory parameters (e.g., packing mode). This is accomplished using a set of HDL attributes or directives. For example, Synopsis® (tools use a "pragma" statement.

There are essentially three types of packing modes: explicit (also called absolute), packed (also called compact), and base aligned. In the explicit packing mode, the array indices are taken as exclusive addresses. Using the packed packing mode, the array indices are packed to eliminate gaps in the memory. In the aligned packing mode, the array indices are generally shifted by a power-of-two number. The aligned packing mode typically reduces the amount of hardware needed for memory address calculation (for example, by eliminating an adder or subtractor), but usually requires more memory.

After the designer designates the type of memory and packing method in the HDL source code (using pragma statements or other directives), the designer runs the source code through the synthesis tool. The synthesis tool generates a report that the designer can use to analyze the performance of the circuit. For example, the user can examine the speed and area of the circuit to determine whether the current memory allocation is acceptable. If the memory allocation is not acceptable, the designer must return to an editor, re-edit the source code to change the memory allocation, and run the source code through the synthesis tool again. Such a technique for modifying the memory allocation is time consuming and inefficient. Moreover, the designer cannot easily visualize how the memory is allocated while modifying the source code.

It is desirable, therefore, to provide a synthesis tool that allows a designer to modify memory resources more quickly and simply. It is further desirable to allow a designer to readily visualize a memory map of the circuit after the designer allocates memory resources.

SUMMARY

The present invention allows a designer to interactively change the memory allocation in an integrated circuit design without having to modify the source code description of the circuit. Using a graphical user interface (GUI), the designer can modify the memory allocation easily and see the results of the new allocation without having to generate the RTL code, perform RTL synthesis, etc. For example, the designer can readily view a memory map of the circuit to better determine whether the memory allocation is acceptable. Additionally, the designer can execute an area-versus-speed analysis, and, if the analysis is not satisfactory, the designer can further modify the memory allocation using the GUI.

In one aspect, a source code file having a description of the hardware is read into a database within the synthesis tool. The synthesis tool analyzes the source code file and generates a data structure associated with the source code file. The designer can then invoke a GUI that lists the variables from the source code, together with the size of the variables, current memory allocation for the variables, and packing mode. The designer can then interactively create new memory resources and drag and drop the variables onto the memory resources to allocate the memory interactively and without having to change the source code file.

In another aspect, the designer can interactively change other parameters associated with the memory resources, such as the memory type, packing mode, etc. Thus, rather than having to change the source code file, the designer can select a memory resource in the GUI and change these memory parameters interactively and dynamically.

In yet another aspect, the designer can view a graphical representation of a memory map that illustrates the mapping of variables to memory addresses. If the designer is dissatisfied with the memory layout, the designer can interactively modify the memory allocation to find a more satisfactory solution.

Further features and advantages of the invention will become apparent with reference to the following detailed description and accompanying drawings.

DETAILED DESCRIPTION

Figure 1:
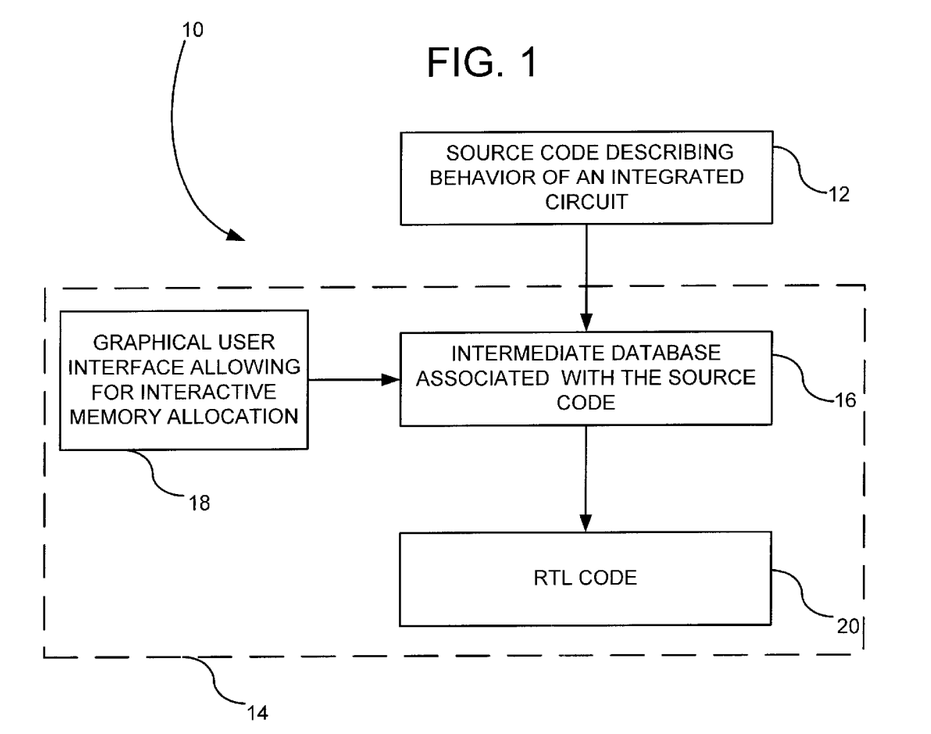
FIG. 1 is a block diagram of a system for allowing interactive memory allocation.

FIG. 1 shows a system 10 for generating an integrated circuit. A designer typically creates a behavioral description of an integrated circuit by generating source code file 12 using a separate editor (not shown). The source code is described generically as HDL and may be written in C, C++, VHDL, Verilog, etc. Once the source code 12 is complete, a behavioral synthesis tool 14 reads in the source code file 12 and allows a designer to evaluate and modify the circuit architecture early in the design process. In particular, the source code 12 is read into an intermediate database 16 that holds the behavioral description as a data structure. This data structure, called a synthesis intermediate format (SIF), is modifiable by the user through a graphical user interface (GUI) 18. The GUI 18 allows the designer to interactively and dynamically modify the memory allocation in the data structure. Additionally, the designer may also quickly evaluate the area and latency associated with different memory architectures. Once the designer is satisfied with the architecture, the RTL code is generated as shown at 20. Further processing is then performed on the RTL code to ultimately generate the integrated circuit. The behavioral synthesis tool 14 may be executed on any desired general purpose computer having a monitor for displaying the GUI and having any desired user input, such as a mouse, keyboard, etc.

In previous systems, in order to change the memory allocation, the designer was required to reload an editor and modify the source code 12 directly. The designer would then have to reload the source code into the behavioral synthesis tool and generate the RTL code in order to evaluate the resulting architecture. The system 10, on the other hand, allows the designer to modify the intermediate database 16 using the graphical user interface 18. Thus, the designer does not have to edit the source code to modify the memory allocation.

Figure 2:
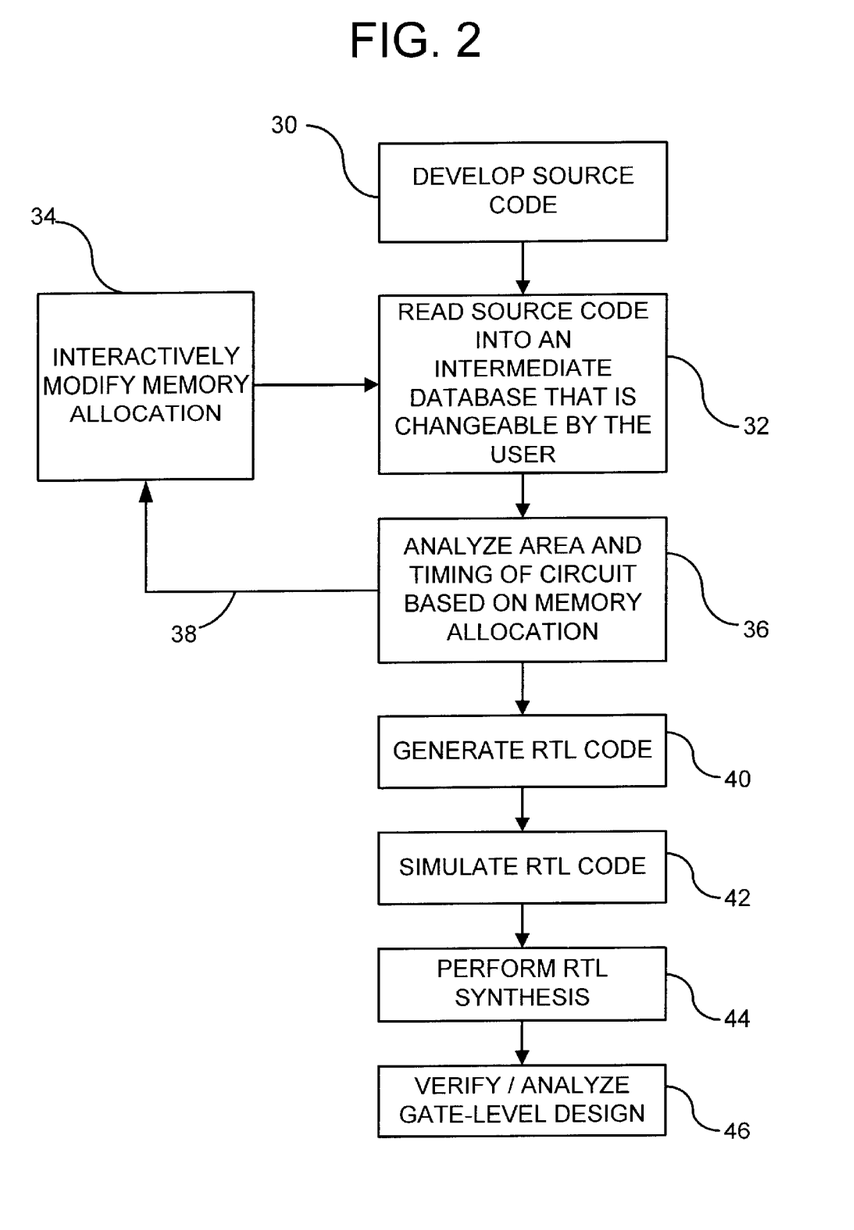
FIG. 2 is a detailed diagram illustrating a design flow for creating an integrated circuit using the system of FIG. 1.

FIG. 2 shows a more detailed flow chart for generating an integrated circuit according to the invention. In process block 30, the designer develops the source code as already described. In process block 32, the behavioral synthesis tool 14 (see FIG. 1) reads the source code into the intermediate database 16 and generates a data structure that is changeable by the designer. When generating the data structure, the synthesis tool performs an analysis of the source code. For example, the synthesis tool searches for operators, signals, and variables in the source code and generates the data structure based on these HDL statements. Additionally, the synthesis tool searches for directives and uses the directives as defaults for the memory allocation in the data structure.

At this point in the flow, the memory allocation information is stored in the intermediate database independently, meaning the information is not yet fully integrated into the SIF. This allows the designer to interactively change the memory allocation and control when such changes are applied to the SIF. The memory allocation information is stored as a set of resources for the design wherein each resource represents a memory resource that may potentially be present in the final integrated circuit design. The resource data structure may be organized in many different ways. One possible organization is to have the following fields:

A unique identification # for the resource

A type of memory to be used for the resource

A list of variables mapped to the resource

A packing mode for the resource

A flag indicating whether the resource is external to the design

Figure 12:
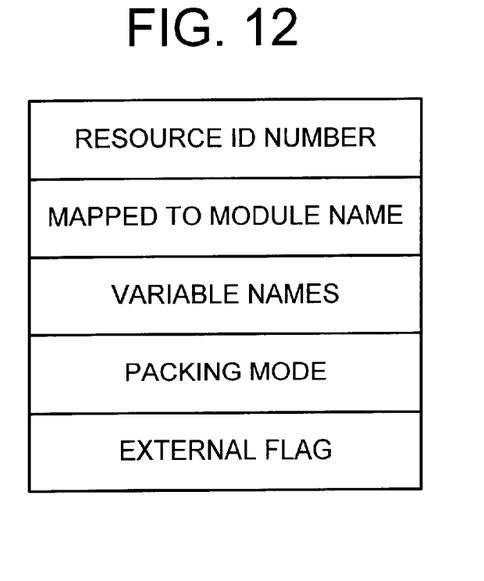
FIG. 12 is an illustration of a data structure for a memory resource object.
Figure 13:
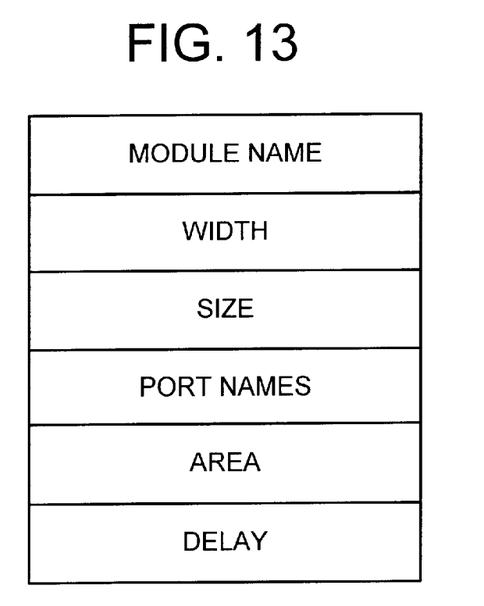
FIG. 13 is an illustration of a data structure for a type of memory module.

Turning briefly to FIGS. 12 and 13, the resource data structure is shown in FIG. 12. FIG. 13 shows a similar illustration for memory module type data structure wherein width represents the module word width, size represents the number of words the module can store, port names represent the read/write ports that exist on the module, area is the area of the memory module, and delay is the time it takes for that module to read or write memory.

The data structure has sufficient information to fully describe the memory resource characteristics. Using this information, the actual memory instance can be created by applying the information to the intermediate data structure at a later point in the design flow.

Returning to FIG. 2, in process block 34, the designer can interactively change he memory allocation for variables that are in the source code. That is, the source code includes variables representing arrays that are associated with memory storage (although in some cases arrays are not mapped to memory). There may be many different memories from which the designer can choose. Memory can vary in size and type (e.g., dual port memory, single port memory, etc.). Thus, in process block 34, the designer can choose which memories to use, the variables associated with those memories, the packing mode, etc. Other features of the GUI are described further below.

After the memories are properly allocated, the designer can perform an initial check to analyze the area and timing of the circuit (process block 36). This may be done, for example, by displaying an area versus latency graph that gives the designer some immediate feedback on whether the memory allocation is satisfactory. If the designer is unhappy with the area or timing, the designer can return to process block 34 to further modify the memory allocation, as shown by arrow 38. On the other hand, if the designer is satisfied with the memory allocation, the RTL code can be generated and simulated (process blocks 40 and 42). Finally, an RTL synthesis tool can perform RTL synthesis (process block 44) and the gate level design can be verified and analyzed (process block 46).

Further details are now given on how the memory allocation is applied to the SIF. After the designer is satisfied with the memory allocation, the designer directs the GUI to apply the memory allocation information to the SIF. Thus, at this point any changes the designer has made to the memory allocation are reflected in the database by modifying the independent set of resources and their field information. Applying this information to SIF involves several steps:

1. Create a memory data object representing each memory resource. This involves determining the size of the memory based on the variables mapped to the memory and the size of the variables, along with the packing mode. Also, since the original variable index may get mapped to a different memory address (based on the packing mode and the order of variables on the memory), offsets are computed for each array/index.

Figure 10:
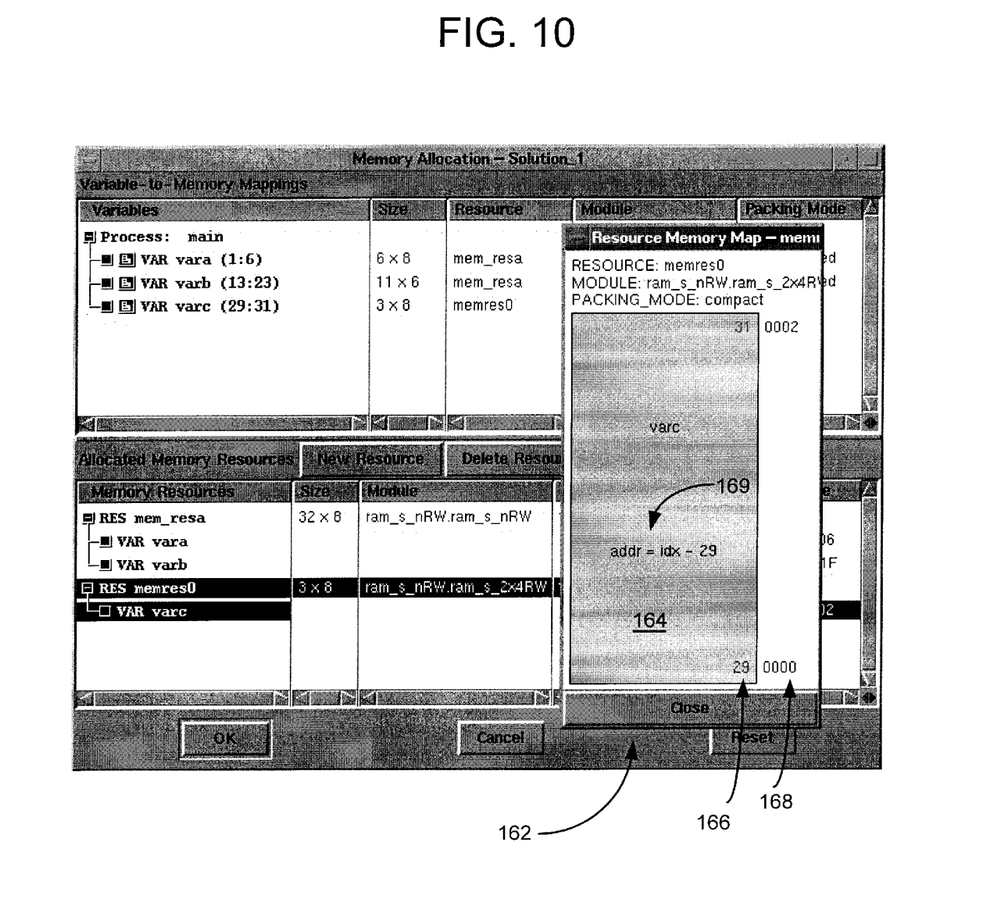
FIG. 10 is an illustration of a graphical user interface showing a memory map for one of the memory resources of FIG. 9.
Figure 11:
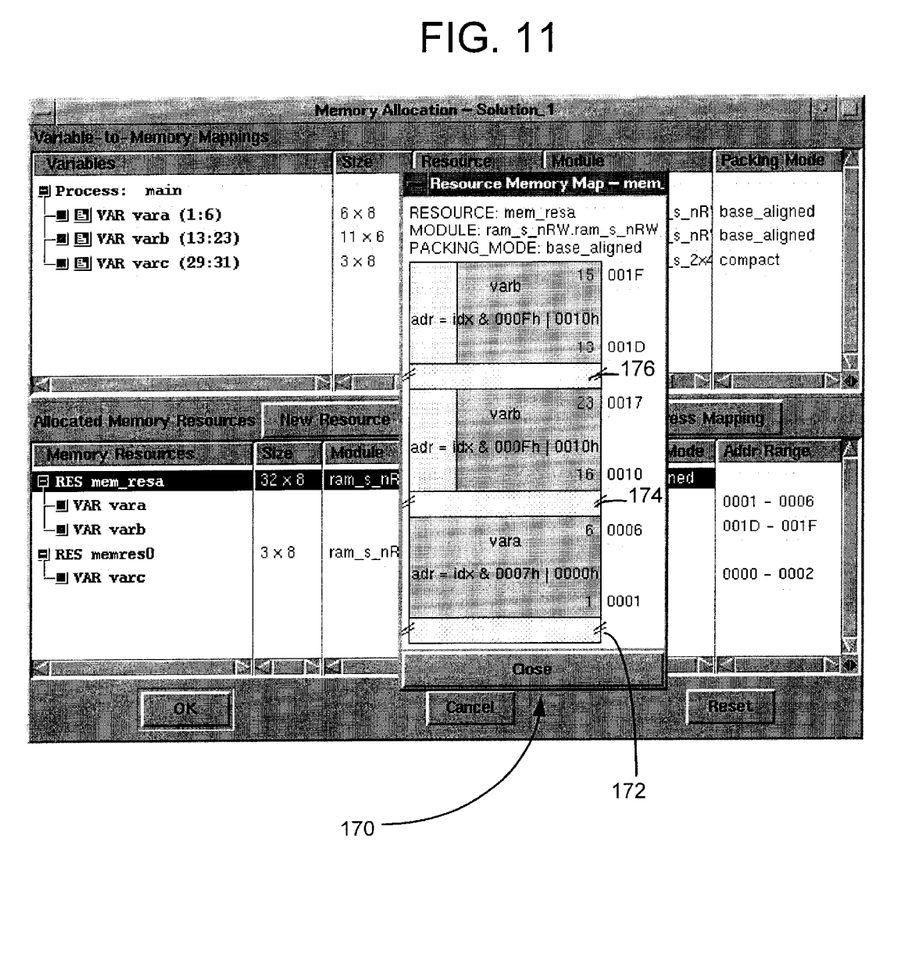
FIG. 11 is an illustration of a graphical user interface displaying a memory map for another memory resource of FIG. 9.

2. Transform all read/write accesses to any of the variables mapped to the memory resource into corresponding read/write(s) to the created memory data object in step 1. Transforming includes modifying the SIF appropriately to reflect the mapping of the original array index to the actual memory address location. This mapping is dependent on the ordering of the variables and the packing mode used. An appropriate offset is inserted for each array index access. This offset insertion is also known as address calculation. For absolute packing mode, no address calculation is needed and the original index is used as is for addressing the memory. Typically, for compact packing mode, an addition/subtraction operation may have to be inserted in SIF for address calculation from the original index (depending on whether the offset is positive/negative). Expression "Addr=idx−29" in box 164 of FIG. 10 gives an example of a subtraction being introduced as part of the address calculation for a compact mode. Finally, for base_aligned packing mode, usually, no real address calculation operation needs to be inserted, but some transformation of the original index should be performed in terms of rewiring (i.e., some high-order bits may be ignored from the index and some other high-order bits may be appended). The SIF is modified to reflect this address calculation transformation from the original array index before accessing the memory. Logical expressions relating Addr and idx in box 170 of FIG. 11 illustrate the address calculation taking place in base_aligned mode.

After these two steps are completed, the memory allocation information is fully integrated into the SIF, and further steps in the design flow include these memories as part of the actual design to be generated. For example, the RTL code is generated using the information integrated into the SIF.

Figure 14:
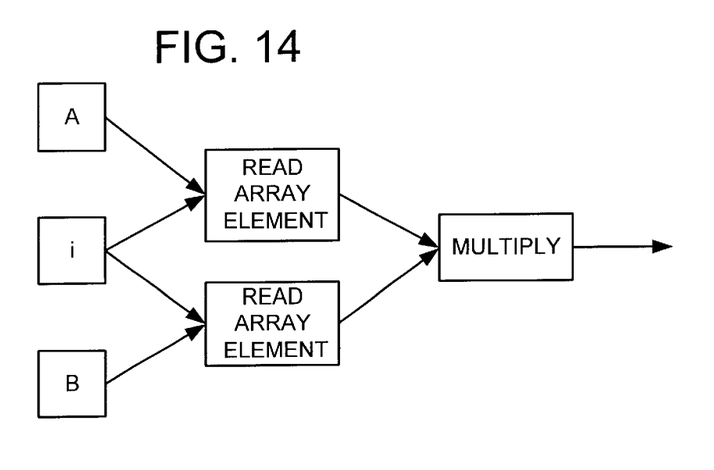
FIG. 14 is a flowchart showing the translation of a design statement into an intermediate format.
Figure 15:
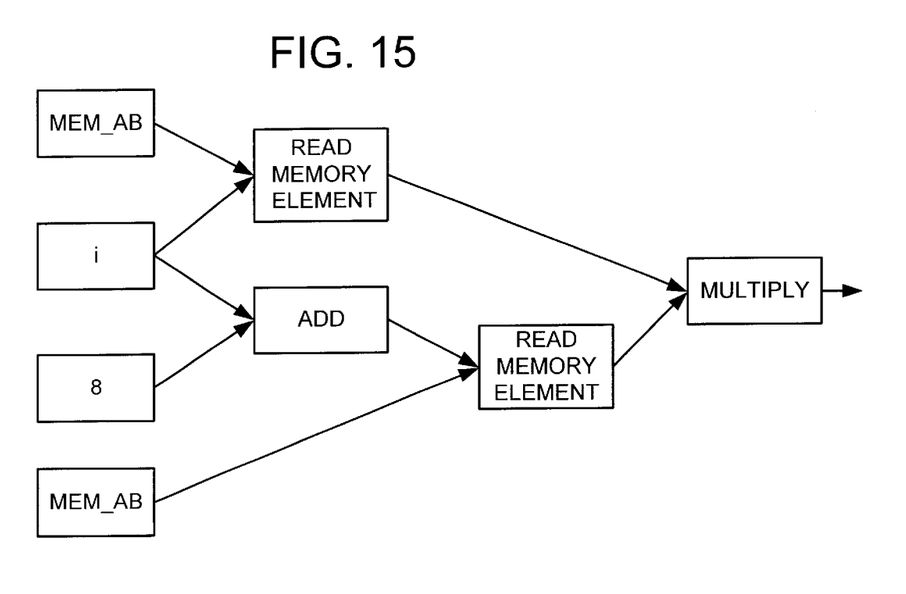
FIG. 15 is a flowchart showing a reconfiguration of the intermediate format of FIG. 14 for a compact packing mode.

FIG. 14 shows an example SIF representation for a design statement "A(i)*B(i)" before applying memory allocation information to the SIF. If the memory allocation chosen implies the arrays A and B were mapped to one memory resource (mem_ab) with compact packing mode, then FIG. 15 represents the SIF after applying memory allocation information to the SIF (assuming array A has 8 elements).

Figure 3:
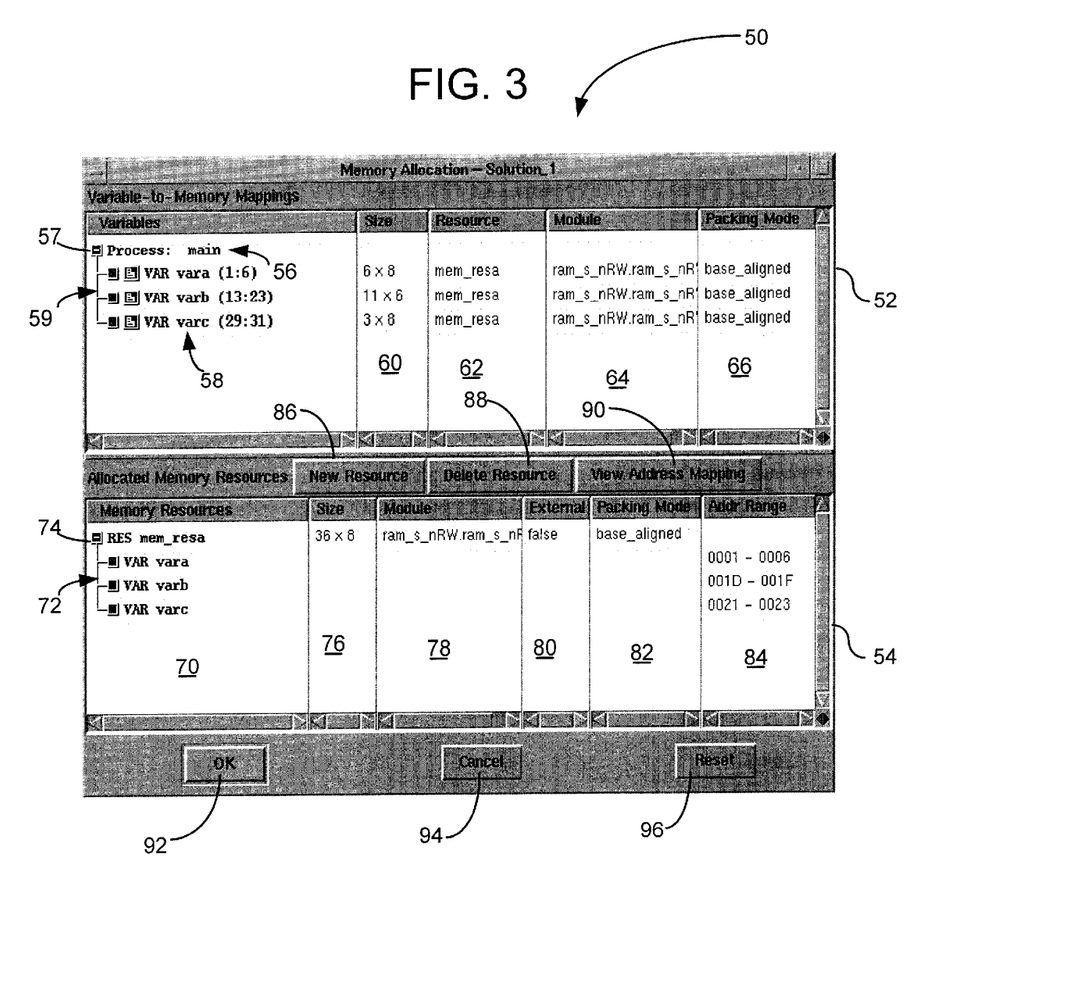
FIG. 3 is an example graphical user interface for allowing a user to interactively allocate memory.

FIG. 3 shows an example of the user interface 50 for allowing the designer to modify memory resources interactively and dynamically. The user interface includes an upper pane 52 and a lower pane 54. The upper pane has a list of processes and variables accessed within those processes. These processes and variables represent the current memory allocation stored in the database 16 and are represented as graphical objects. When the synthesis tool 14 generates the data structure stored in database 16, the source code directives regarding variables and memory allocation are identified and are used as default settings for memory allocation. Using the GUI of the present invention, a designer may choose to create the source code with no directives indicating memory allocation. In such a case, the designer interactively specifies the memory allocation via the GUI.

However, in the illustrated example, the designer did include directives in the source code that are used as default settings. For example, the synthesis tool 14 identified a process entitled "Main" (shown at 56) in the source code. The array variables associated with that process are shown at 58 and include variables A, B, and C designated as "vara", "varb", and "varc". The variables are shown using a hierarchical structure at 59 typical of Windows applications. The hierarchical structure is a tree structure wherein the processes are shown at the top level and variables are shown as the leaves or sub-levels. Box 57 currently has a minus sign shown therein, which means the leaf variables associated with that process are displayed. The box 57 may be selected using a mouse pointer. If so, the minus sign is replaced with a plus sign and only the top level processes are shown. Adjacent to each variable is the array indices associated with that variable. For example, vara is an array having indices (1:6), meaning it has 6 elements in the array. The upper pane 52 also includes sub-panes entitled "size" 60, "resource" 62, "module" 64, and "packing mode" 66. The size sub-pane 60 provides the array size for each variable. For example, vara is a size 6×8 meaning it has 6 words, each 8 bits in width. The resource sub-pane 62 provides a symbolic name of a resource associated with the variables. In this case, "mem_resa" is a memory resource used for all the variables. The module sub-pane 64 provides the actual memory type for the resource mem_resa. The packing mode sub-pane 66 shows the current packing mode used for each of the variables. In the current system, there are three possible packing modes called absolute, compact, and base-aligned. Additional packing modes can be added to the system. In the current example, each of the illustrated variables is assigned a base-aligned packing mode as can be seen from the packing mode sub-pane 66. Any of the sub-panes may be removed or additional sub-panes may be added.

The lower pane 54 is used by the designer to change the memory allocation of the circuit. Thus, lower pane 54 includes details of a desired (potential) memory allocation. For example, a memory resource sub-pane 70 shows that there is currently one memory resource (i.e., mem_resa) allocated in the system. Each of the 3 variables currently assigned to that memory are shown by the hierarchical structure at 72. In the hierarchical structure the memory resources are shown at the top level and variables are shown as the leaves. Box 74 can be toggled (similar to box 57) to show only the top level of the hierarchy or the top level and leaves. The lower pane 54 also has a "size" sub-pane 76 showing the current size of the memory, mem_resa. For example, mem_resa is shown as being a size "36×8" meaning the memory contains 36 words, each 8 bits wide. A "module" sub-pane 78 shows the type of memory associated with the memory resource. An "external" sub-pane 80 shows whether the memory will be within the integrated circuit or outside of the integrated circuit. A "packing mode" sub-pane 82 provides the packing mode associated with this memory similar to packing mode pane 66. Finally, an "address range" sub-pane 84 shows the actual addresses that the variables are stored in memory (addresses are shown in hexadecimal format). Any of the sub-panes may be removed or additional sub-panes may be added.

Three buttons located between the upper and lower panes 52, 54 include a "new resource" button 86, a "delete resource" button 88 and a "view address mapping" button 90. The new resource button 86 is used to interactively create new memory resources, as is described further below. The delete resource button 88 is used to delete current resources identified in the memory resources pane 70. The view address button 90 provides a visual view of the variable mapping of a currently selected memory resource.

Three buttons are located at the bottom of the lower pane 54 and include an "OK" button 92, a "cancel" button 94 and a "reset" button 96. The OK button is used to save the memory allocation settings found in lower pane 54 to the data structure. The cancel button 94 exits the user from the window 50 without any changes to the stored memory allocation settings. The reset button 96 is used to erase the current settings in the lower pane 54 so that the designer can start anew.

Figure 4:
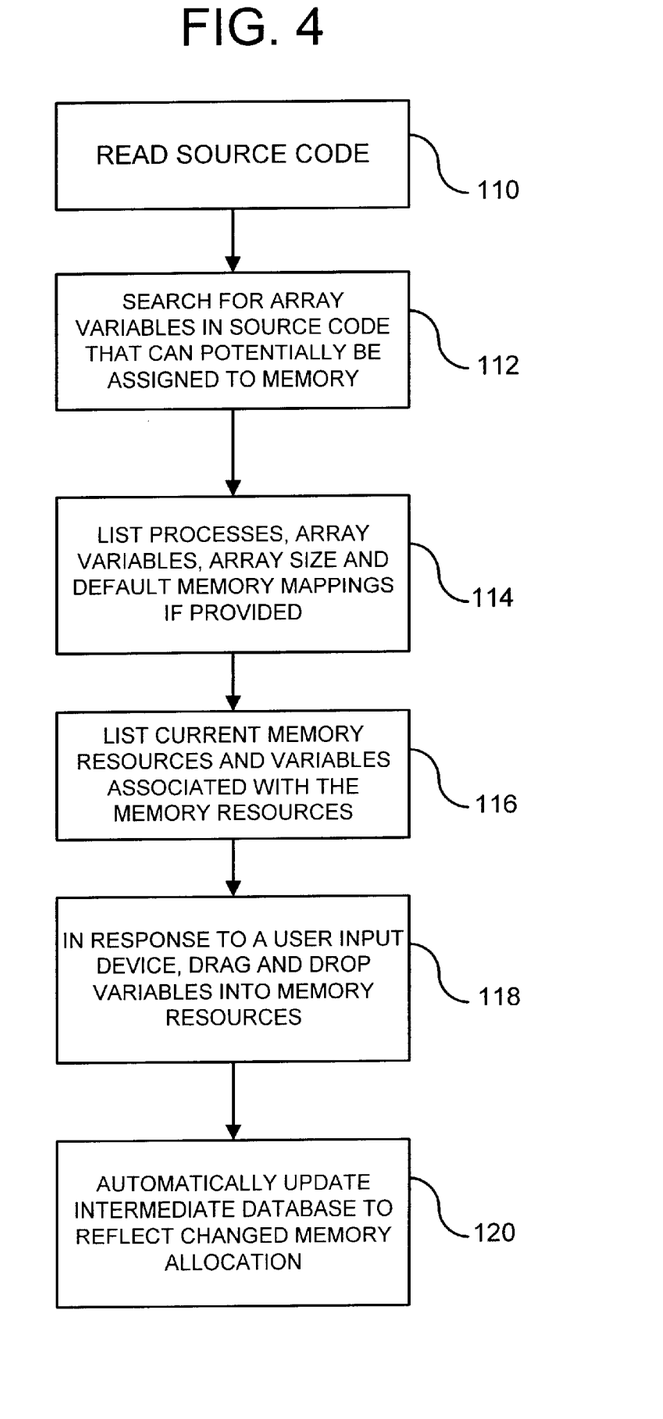
FIG. 4 is a flow diagram of a method for modifying memory allocation interactively using the graphical user interface of FIG. 3.

FIG. 4 shows a flow chart of a method that further illustrates some of the features of the user interface of FIG. 3. In process block 110, the behavioral synthesis tool reads in the source code file. In process block 112, the behavioral synthesis tool searches through the source code to find different processes and array variables accessed within those processes. In process block 114, the processes and variables accessed within those processes are listed in the upper pane 52 of the user interface (see 56 and 58 in FIG. 3) in a hierarchical fashion so that the designer can immediately associate the variables with the processes. Additionally, the array size and current memory mappings (obtained from the source code) are also displayed in the upper pane 52. In process block 116, the user interface lists the current memory resources and variables associated with the memory resources as indicated in FIG. 3 in memory resource pane 70. The designer may also create new memory resources that were not identified in the source code file, as further described below.

In process block 118, the designer can drag and drop variables onto memory resources using a user input device (e.g., mouse, keyboard, etc.). For example, if the designer selects varc from the list of variables 58, the designer can drag that variable to the memory resource pane 70 and drop varc onto a desired memory resource. The size of the memory resource shown in the size pane 76 is updated automatically to ensure that the memory size is sufficient to handle the size of the variable. The designer can also change the memory resource parameters, such as the type, packing mode, etc. In process block 120, if the designer selects the OK button 92, the data structure stored in the intermediate database 16 (FIG. 1) is automatically updated to reflect the changes made by the designer.

Figure 5:
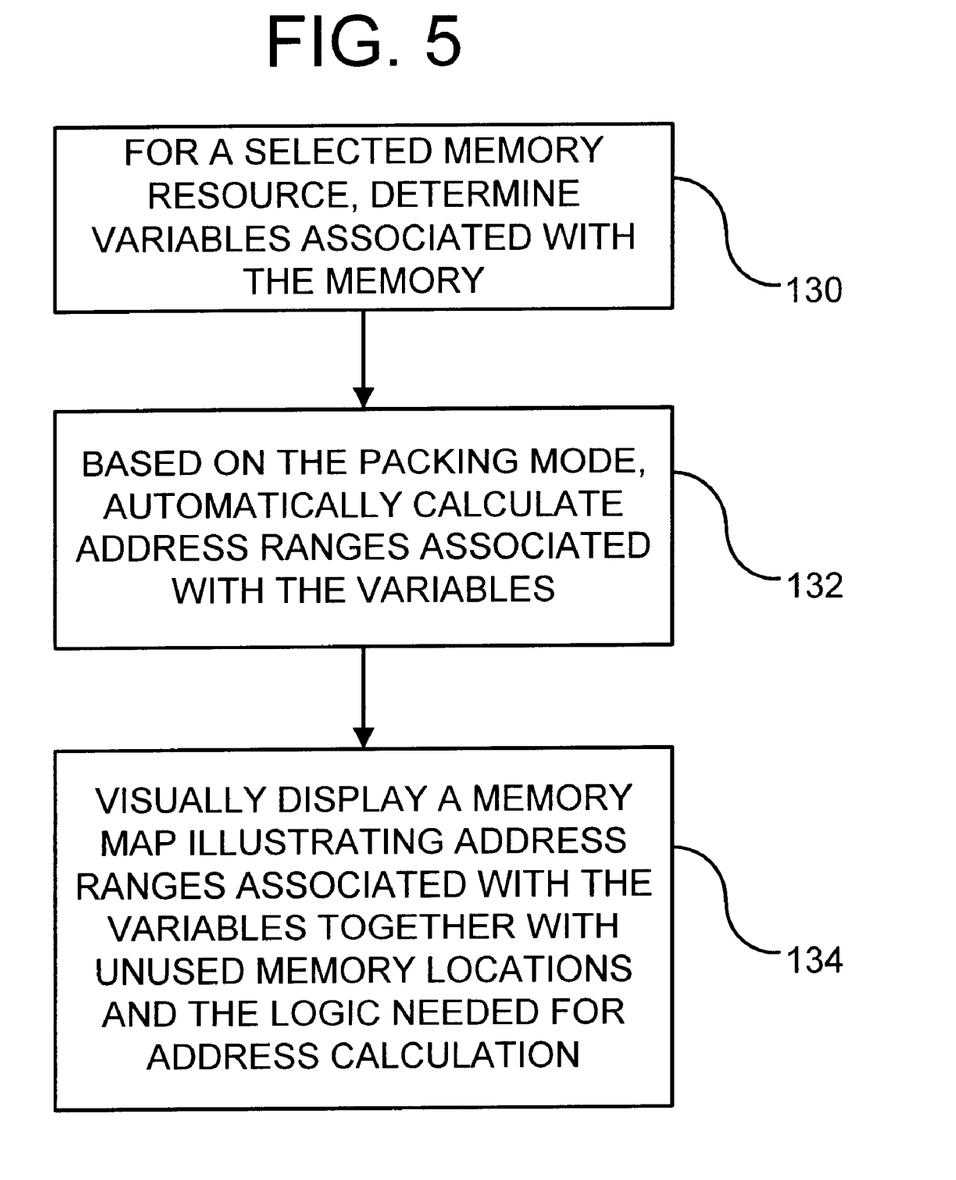
FIG. 5 is a flow chart of a method for displaying a memory map based on the desired memory allocation.

FIG. 5 shows a flow chart of a method for visually displaying to the designer a memory mapping associated with the memory allocation window 50. In process block 130, the behavioral synthesis tool determines the variables associated with the memory. These variables are obtained from the memory resources pane 70 (FIG. 3). In process block 132, the behavioral synthesis tool automatically calculates address ranges associated with the variables based on the current packing mode identified in the packing mode sub-pane 82. The various addresses are automatically updated in the address range sub-pane 84. If the designer selects the View Address Mapping button 90 (FIG. 3), then a memory map illustrating the address ranges associated with the variables is displayed together with unused memory locations (process block 134). Logic may also be shown indicating how the addresses are calculated, as described further below.

Figure 6:
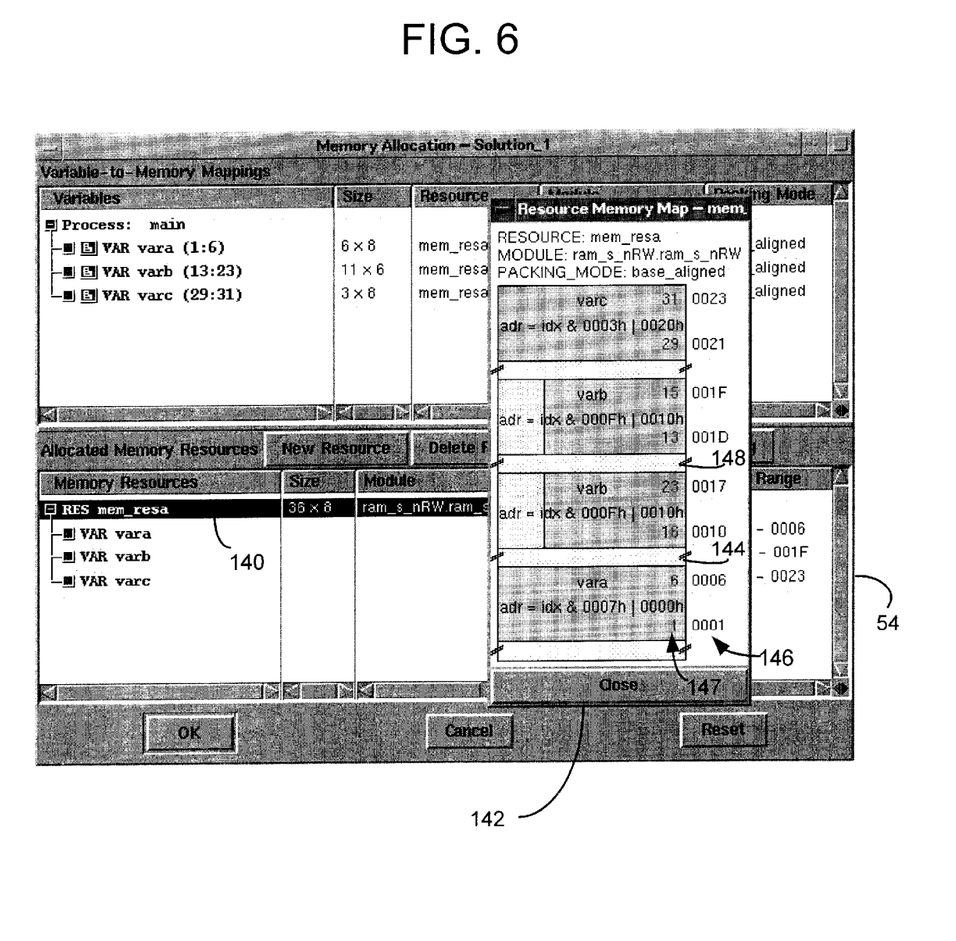
FIG. 6 is an illustration of a graphical user interface displaying a memory map.

FIG. 6 shows an example of such an address map being visually displayed as described in FIG. 5. The designer first selects a memory resource in the lower pane 54, which causes the resource to be highlighted as shown at 140 in FIG. 6. Then the designer selects the View Address Mapping button 90 and a sub-window 142 is displayed. The sub-window 142 graphically shows the designer the memory mapping for the highlighted resource, in this case mem_resa. As can be seen, the memory map graphically illustrates where the variables are located in memory and where unused addresses are located, such as that shown at 144. The actual memory addresses are shown at 146 and the corresponding array indices of the variables are shown at 147, adjacent the actual memory addresses. It should be noted that the base-aligned packing mode causes the variables to be stored in memory such that they can be addressed simply without the need for complex hardware (such as an adder or subtractor). Using this packing mode, a single array (such as varb) may be divided up with unused memory addresses dividing the array, such as at 148.

Figure 7:
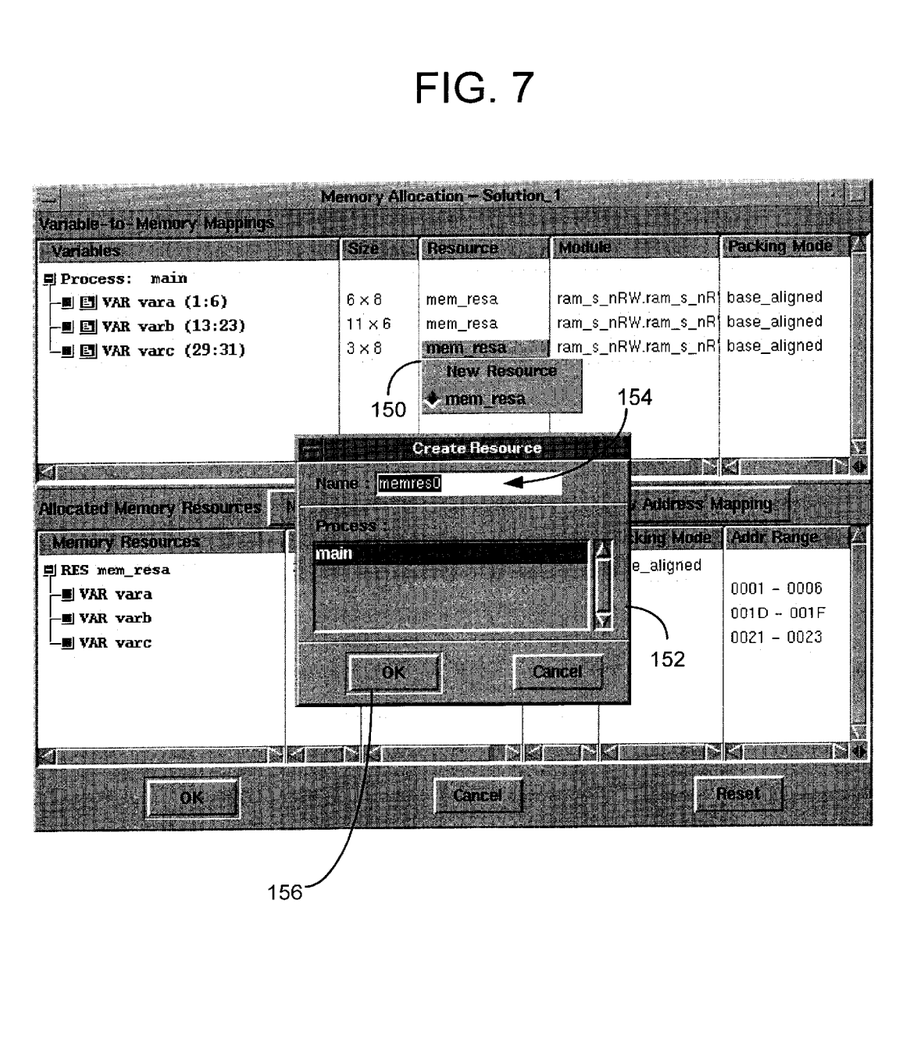
FIG. 7 is an illustration of a graphical user interface wherein the user dynamically creates a new memory resource.

FIG. 7 shows an example of moving the varc variable to a new memory resource called memres0. First, by selecting the current memory resource for varc, a sub-window is displayed as shown at 150. The designer can then select "New Resource", which causes the sub-window 152 to be displayed. This sub-window includes a name field 154 wherein the designer can enter a name for the new memory resource. With the proper name inserted, the OK button 156 is selected to create the new memory resource. This new memory resource is used to interactively modify the memory allocation of the integrated circuit.

Figure 8:
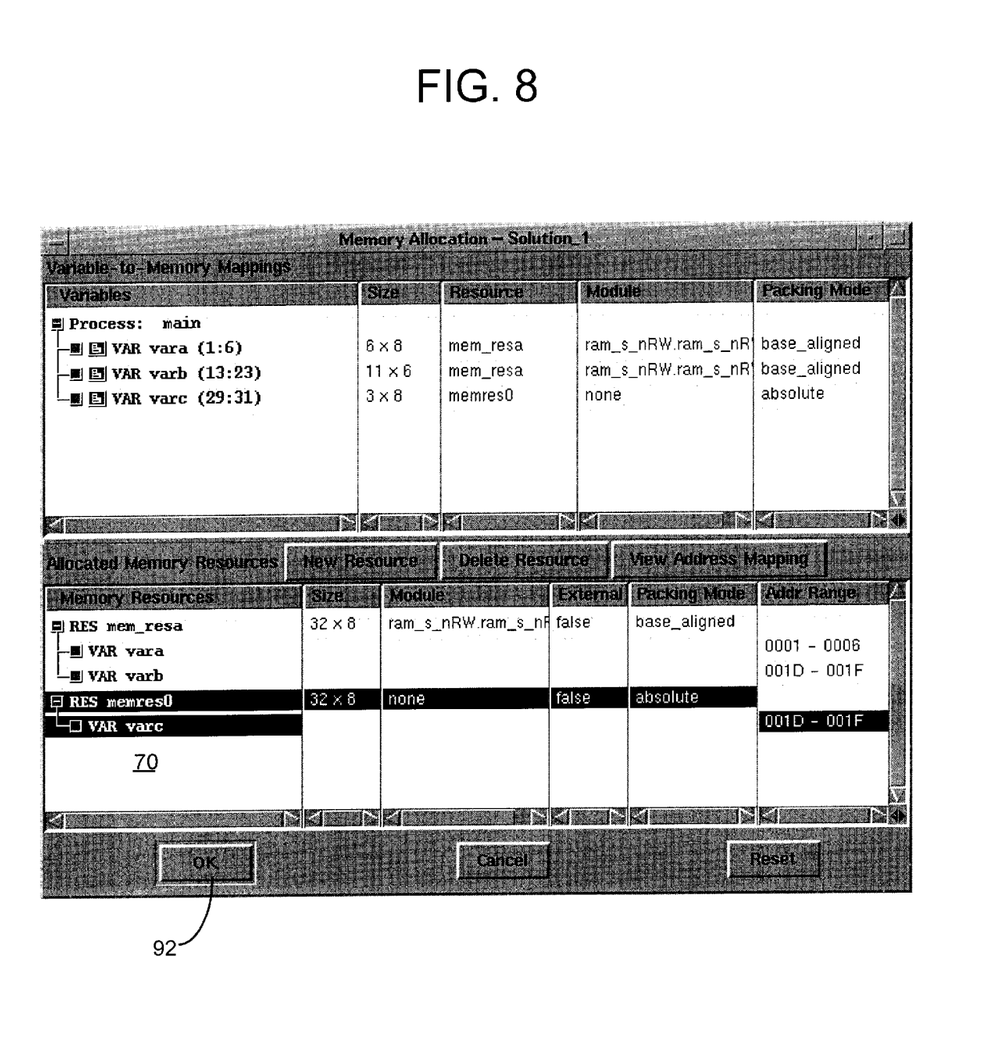
FIG. 8 is an illustration of a graphical user interface showing that the memory resource of FIG. 7 has been created and a variable assigned to the memory resource.

FIG. 8 shows the user interface after memres0 is created. Notably, in the memory resources pane 70, the hierarchical display of memory resources shows two top-level memory resources and, at a sublevel, variables associated with each memory resource. For example, vara and varb are shown as included under mem_resa and varc is shown under memres0. Because memres0 was just created, it does not have a memory type associated with it (see Module pane). Additionally, the external pane is shown having memres0 to false and the packing mode to absolute (as defaults). At this point, the designer is investigating different potential memory layouts that are displayed in the lower pane 54. It is not until the designer selects the OK button 92, that the data structure stored in database 16 is updated.

Figure 9:
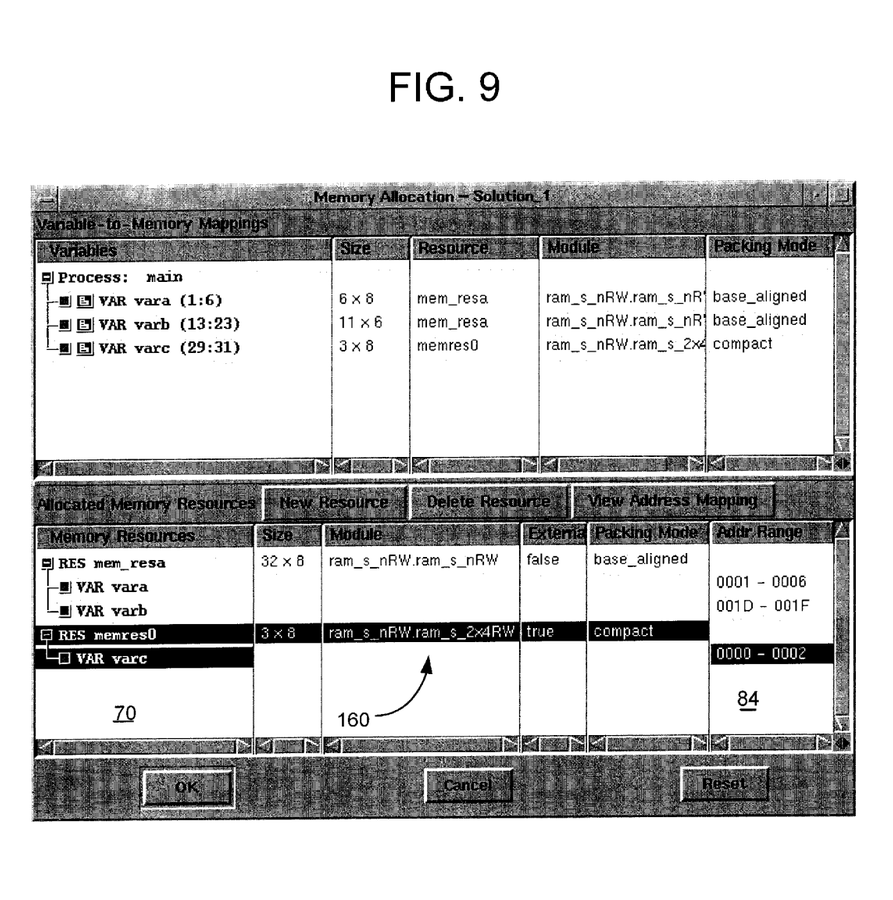
FIG. 9 is an illustration of a graphical user interface wherein the parameters associated with the memory resource of FIG. 8 are dynamically changed.

FIG. 9 shows that the designer has assigned a memory type to memres0 as indicated at 160. Additionally, the external parameter has been changed to "true" and the packing mode to "compact". As shown in the address range pane 84, the address is automatically calculated based on the packing mode and the size of varc. Those skilled in the art will recognize that the memory resource memres0 was not defined in the source code file 12. Instead, the memres0 was created interactively by the designer. The designer can readily move variables between resources in pane 70 using drag and drop operations. For example, the designer can drag vara in pane 70 to memres0. This operation would cause the GUI to automatically delete vara from its association with mem_resa and automatically associate vara with memres0.

FIG. 10 shows a memory map window 162 for varc. First the designer selects memres0 as the desired memory to view the memory map, then the designer selects the View Address Mapping button. The memory map window 162 is then generated and displayed. The memory area taken by varc is shown as a graphical representation by block 164. The array indices are shown at 166 and the actual corresponding memory addresses are shown at 168 adjacent the array indices so that a one-to-one mapping between the array indices and the actual memory addresses can readily be seen. Additionally, logic is shown at 169 to indicate how the addresses are calculated.

FIG. 11 shows a memory map window 170 for mem_resa. The packing mode is base aligned and, consequently, the arrays are automatically organized in memory so that they may be easily addressed. Memory location 0 is unused as seen by a graphical representation of an empty block at 172. The vara variable starts at actual address 0001 and stops at address 0006. Another empty block shown at 174 separates vara from varb. In the base-aligned packing mode, an individual array may be divided up as shown by empty block 176.

Having illustrated and described the principles of the illustrated embodiments, it will be apparent to those skilled in the art that the embodiments can be modified in arrangement and detail without departing from such principles.

For example, although a particular GUI was shown, the user interface can be modified to illustrate the variables and resources in a different way. The particular user interface used is not important to the invention.

Additionally, the data structure stored in database 16 can be structured in a wide variety of ways. The particular data structure used is not important to the invention.

Moreover, although the description focuses on arrays, variables that are associated with single registers in an integrated circuit may also be modified using the GUI.

Although a particular data structure is illustrated, those skilled in the art recognize that a wide variety of data structures may be used.

In view of the many possible embodiments to which the principles of our invention may be applied, it should be recognized that the illustrated embodiment is only a preferred example of the invention and should not be taken as a limitation on the scope of the invention. Rather, the scope of the invention is defined by the following claims. We therefore claim as our invention all that comes within the scope of these claims.

We claim:

1. A method of allocating memory in a behavioral synthesis tool used to design an integrated circuit, comprising:
   reading a source code description associated with the integrated circuit into the behavioral synthesis tool, the source code description having at least one array;
   storing the source code description as a data structure within the behavioral synthesis tool; and
   using a graphical user interface to map the array to a memory to be used by the integrated circuit by modifying the data structure within the behavioral synthesis tool.

2. The method of claim 1, further including searching the data structure for arrays listed in the source code description and listing the arrays in the graphical user interface.

3. The method of claim 1, further including displaying a memory map on the graphical user interface.

4. The method of claim 3, wherein the memory map is a graphical representation of the memory showing locations of the arrays in memory.

5. The method of claim 4, further including graphically displaying on the memory map unused memory locations.

6. The method of claim 1, further including creating one or more memory resources using the graphical user interface and moving one or more arrays into the memory resources.

7. The method of claim 6, further including automatically calculating address ranges for the arrays in the one or more memory resources.

8. The method of claim 6, further including modifying parameters associated with the memory resources using the graphical user interface, the parameters including a type of memory and a packing mode.

9. The method of claim 8, further including automatically calculating address ranges for a memory resource, the calculation taking into account the packing mode.

10. The method of claim 1, further including:
    using the graphical user interface, creating a memory resource to be used by the integrated circuit; and
    using the graphical user interface, creating an association between an array with the memory resource using a drag-and-drop operation.

11. The method of claim 10, further including dragging the graphical object representation of the array to the memory resource and dropping the object on the memory resource.

12. The method of claim 1, further including displaying an association between arrays and memories using a hierarchical representation.

13. The method of claim 1, wherein the graphical user interface is used to assign arrays to memory resources and further including automatically updating the data structure in response to user input indicating that memory allocation is complete.

14. A computer-readable medium having computer-executable instructions for performing the method of claim 1.

15. A synthesis tool that allows for interactive memory allocation in the design of integrated circuits, comprising:
    a source code description file that describes functionality of an integrated circuit;
    memory that stores an intermediate database associated with a source code description file of the integrated circuit; and
    a graphical user interface that allows a designer to interactively allocate memory for the integrated circuit by modifying the database and without modifying the source code description file.

16. The tool of claim 15, wherein the graphical user interface includes a window listing array variables used in the source code description file.

17. The tool of claim 15, wherein the graphical user interface includes a memory mapping window that provides a graphical display of a mapping of addresses for a memory resource.

18. The tool of claim 15, wherein the database is used to generate RTL code.

19. A behavioral synthesis tool, comprising:

means for generating a synthesis intermediate format associated with a source code description of an integrated circuit; and means for allowing a user to interactively modify memory allocation by modifying the synthesis intermediate format.

20. The behavioral synthesis tool of claim 19, further including means for generating RTL code from the synthesis intermediate format.

21. The behavioral synthesis tool of claim 19, further including means for displaying a memory map showing a graphical representation of array variables and memory addresses associated with the arrays.

22. A method of allocating memory in a behavioral synthesis tool used to design an integrated circuit, comprising:

displaying, in a graphical user interface, array variables associated with a source code description of the integrated circuit;

displaying, in the graphical user interface, memory resources associated with the integrated circuit; and assigning the array variables to the memory resources using the graphical user interface.

23. The method of claim 22, further including creating a memory resource, not identified in the source code description, using the graphical user interface.

24. The method of claim 22, further including modifying a data structure generated from the source code description based on the variables assigned to the memory resources.

25. The method of claim 22, wherein the memory resources have a packing mode associated therewith, and the packing modes are modifiable interactively using the graphical user interface.

26. The method of claim 22, further including reading the source code description into the behavioral synthesis tool and wherein the assigning is accomplished using the behavioral synthesis tool without modifying the source code description.

27. The method of claim 22, further including displaying a memory map for a memory resource, the memory map including a graphical representation of the variables associated with the memory resource, and memory addresses where the variables are stored.

28. The method of claim 22, wherein the assigning of the array variables includes dragging the array variables to the memory resources.

29. The method of claim 22, wherein the assigning of the array variables includes using a pull-down menu listing the memory resources.

* * * * *